(12) United States Patent
Riepen et al.

(10) Patent No.: US 10,268,127 B2
(45) Date of Patent: *Apr. 23, 2019

(54) LITHOGRAPHIC APPARATUS AND DEVICE MANUFACTURING METHOD

(71) Applicant: ASML NETHERLANDS B.V., Veldhoven (NL)

(72) Inventors: Michel Riepen, Veldhoven (NL); Christiaan Alexander Hoogendam, Veldhoven (NL); Paulus Martinus Maria Liebregts, Veldhoven (NL); Ronald Van Der Ham, Maarheeze (NL); Wilhelmus Franciscus Johannes Simons, Beesel (NL); Daniël Jozef Maria Direcks, Simpelveld (NL); Paul Petrus Joannes Berkvens, Veldhoven (NL); Eva Mondt, Eindhoven (NL); Gert-Jan Gerardus Johannes Thomas Brands, Waalre (NL); Koen Steffens, Veldhoven (NL); Han Henricus Aldegonda Lempens, Weert (NL); Mathieus Anna Karel Van Lierop, Eindhoven (NL); Christophe De Metsenaere, Eindhoven (NL); Marcio Alexandre Cano Miranda, Eindhoven (NL); Patrick Johannes Wilhelmus Spruytenburg, Eindhoven (NL); Joris Johan Anne-Marie Verstraete, Waalre (NL); Franciscus Johannes Joseph Janssen, Eindhoven (NL)

(73) Assignee: ASML NETHERLANDS B.V., Veldhoven (NL)

( * ) Notice: Subject to any disclaimer, the term of this patent is extended or adjusted under 35 U.S.C. 154(b) by 0 days.

This patent is subject to a terminal disclaimer.

(21) Appl. No.: 15/589,705

(22) Filed: May 8, 2017

(65) Prior Publication Data
US 2017/0242348 A1 Aug. 24, 2017

Related U.S. Application Data

(60) Continuation of application No. 14/106,403, filed on Dec. 13, 2013, now Pat. No. 9,645,506, which is a
(Continued)

(51) Int. Cl.
*G03F 7/20* (2006.01)

(52) U.S. Cl.
CPC ...... *G03F 7/70866* (2013.01); *G03F 7/70341* (2013.01)

(58) Field of Classification Search
CPC .................... G03F 7/70341; G03F 7/70866
See application file for complete search history.

(56) References Cited

U.S. PATENT DOCUMENTS

| 3,573,975 A | 4/1971 | Dhaka et al. |
| 3,648,587 A | 3/1972 | Stevens |

(Continued)

FOREIGN PATENT DOCUMENTS

| DE | 206 607 | 2/1984 |
| DE | 221 563 | 4/1985 |

(Continued)

OTHER PUBLICATIONS

M. Switkes et al., "Immersion Lithography at 157 nm", MIT Lincoln Lab, Orlando Jan. 2001, Dec. 17, 2001.
(Continued)

*Primary Examiner* — Deoram Persaud
(74) *Attorney, Agent, or Firm* — Pillsbury Winthrop Shaw Pittman, LLP

(57) ABSTRACT

A liquid confinement system for use in immersion lithography is disclosed in which the meniscus of liquid between
(Continued)

the liquid confinement system and the substrate is pinned substantially in place by a meniscus pinning feature. The meniscus pinning feature comprises a plurality of discrete outlets arranged in a polygonal shape.

20 Claims, 8 Drawing Sheets

Related U.S. Application Data division of application No. 11/987,569, filed on Nov. 30, 2007, now Pat. No. 8,634,053.

(60) Provisional application No. 60/999,774, filed on Dec. 7, 2006.

(56) References Cited

U.S. PATENT DOCUMENTS

| | | |
|---|---|---|
| 4,346,164 A | 8/1982 | Tabarelli et al. |
| 4,390,273 A | 6/1983 | Loebach et al. |
| 4,396,705 A | 8/1983 | Akeyama et al. |
| 4,405,701 A | 9/1983 | Banks et al. |
| 4,480,910 A | 11/1984 | Takanashi et al. |
| 4,509,852 A | 4/1985 | Tabarelli et al. |
| 5,040,020 A | 8/1991 | Rauschenbach et al. |
| 5,121,256 A | 6/1992 | Corle et al. |
| 5,610,683 A | 3/1997 | Takahashi |
| 5,715,039 A | 2/1998 | Fukuda et al. |
| 5,825,043 A | 10/1998 | Suwa |
| 5,900,354 A | 5/1999 | Batchelder |
| 6,191,429 B1 | 2/2001 | Suwa |
| 6,236,634 B1 | 5/2001 | Lee et al. |
| 6,600,547 B2 | 7/2003 | Watson et al. |
| 6,603,130 B1 | 8/2003 | Bisschops et al. |
| 7,367,345 B1 * | 5/2008 | Hemker ............ G03F 7/70341 134/115 R |
| 7,826,031 B2 | 11/2010 | Hara et al. |
| 7,847,916 B2 | 12/2010 | Hara et al. |
| 2002/0020821 A1 | 2/2002 | Van Santen et al. |
| 2002/0163629 A1 | 11/2002 | Switkes et al. |
| 2003/0123040 A1 | 7/2003 | Almogy |
| 2004/0000627 A1 | 1/2004 | Schuster |
| 2004/0075895 A1 | 4/2004 | Lin |
| 2004/0114117 A1 | 6/2004 | Bleeker |
| 2004/0119954 A1 | 6/2004 | Kawashima et al. |
| 2004/0125351 A1 | 7/2004 | Krautschik |
| 2004/0136494 A1 | 7/2004 | Lof et al. |
| 2004/0160582 A1 | 8/2004 | Lof et al. |
| 2004/0165159 A1 | 8/2004 | Lof et al. |
| 2004/0207824 A1 | 10/2004 | Lof et al. |
| 2004/0211920 A1 | 10/2004 | Derksen et al. |
| 2004/0239954 A1 | 12/2004 | Bischoff |
| 2004/0263809 A1 | 12/2004 | Nakano |
| 2005/0007569 A1 | 1/2005 | Streefkerk et al. |
| 2005/0018155 A1 | 1/2005 | Cox et al. |
| 2005/0024609 A1 | 2/2005 | De Smit et al. |
| 2005/0030497 A1 | 2/2005 | Nakamura |
| 2005/0046813 A1 | 3/2005 | Streefkerk et al. |
| 2005/0046934 A1 | 3/2005 | Ho et al. |
| 2005/0052632 A1 | 3/2005 | Miyajima |
| 2005/0094116 A1 | 5/2005 | Flagello et al. |
| 2005/0094125 A1 | 5/2005 | Arai |
| 2005/0122505 A1 | 6/2005 | Miyajima |
| 2005/0132914 A1 | 6/2005 | Mulkens et al. |
| 2005/0134817 A1 | 6/2005 | Nakamura |
| 2005/0140948 A1 | 6/2005 | Tokita |
| 2005/0146693 A1 | 7/2005 | Ohsaki |
| 2005/0146694 A1 | 7/2005 | Tokita |
| 2005/0151942 A1 | 7/2005 | Kawashima |
| 2005/0200815 A1 | 9/2005 | Akamatsu |
| 2005/0213065 A1 | 9/2005 | Kitaoka |
| 2005/0213066 A1 | 9/2005 | Sumiyoshi |
| 2005/0217703 A1 | 10/2005 | O'Donnell |
| 2005/0219489 A1 | 10/2005 | Nei et al. |
| 2005/0233081 A1 | 10/2005 | Tokita |
| 2005/0253090 A1 | 11/2005 | Gau et al. |
| 2006/0028632 A1 | 2/2006 | Hazelton et al. |
| 2006/0038968 A1 | 2/2006 | Kemper et al. |
| 2006/0061739 A1 | 3/2006 | Hoogendam et al. |
| 2006/0103821 A1 | 5/2006 | Verspay et al. |
| 2006/0232756 A1 | 10/2006 | Lof et al. |
| 2007/0002299 A1 | 1/2007 | Imai |
| 2007/0030464 A1 | 2/2007 | Kemper et al. |
| 2007/0081140 A1 | 4/2007 | Beckers et al. |
| 2007/0268466 A1 | 11/2007 | Leenders et al. |
| 2008/0111984 A1 | 5/2008 | Shibuta |
| 2008/0212046 A1 | 9/2008 | Riepen et al. |
| 2008/0212056 A1 | 9/2008 | Shiraishi |
| 2008/0239261 A1 | 10/2008 | Novak |
| 2009/0128793 A1 | 5/2009 | Hara et al. |
| 2009/0279060 A1 | 11/2009 | Direcks |
| 2009/0279062 A1 | 11/2009 | Direcks |
| 2010/0085545 A1 | 4/2010 | Direcks |
| 2010/0103391 A1 | 4/2010 | Van Den Dungen |
| 2010/0313974 A1 | 12/2010 | Riepen |
| 2011/0199593 A1 | 8/2011 | Riepen |
| 2014/0098353 A1 | 4/2014 | Riepen et al. |

FOREIGN PATENT DOCUMENTS

| | | |
|---|---|---|
| DE | 224 448 | 7/1985 |
| DE | 242 880 | 2/1987 |
| EP | 0023231 | 2/1981 |
| EP | 0418427 | 3/1991 |
| EP | 1039511 | 9/2000 |
| EP | 1 420 300 A2 | 5/2004 |
| EP | 1 420 300 A3 | 8/2005 |
| FR | 2474708 | 7/1981 |
| JP | 58-202448 | 11/1983 |
| JP | 62-065326 | 3/1987 |
| JP | 62-121417 | 6/1987 |
| JP | 63-157419 | 6/1988 |
| JP | 04-305915 | 10/1992 |
| JP | 04-305917 | 10/1992 |
| JP | 06-124873 | 5/1994 |
| JP | 07-132262 | 5/1995 |
| JP | 07-220990 | 8/1995 |
| JP | 10-228661 | 8/1998 |
| JP | 10-255319 | 9/1998 |
| JP | 10-303114 | 11/1998 |
| JP | 10-340846 | 12/1998 |
| JP | 11-176727 | 7/1999 |
| JP | 2000-058436 | 2/2000 |
| JP | 2001-091849 | 4/2001 |
| JP | 2004-193252 | 7/2004 |
| JP | 2004-289126 | 10/2004 |
| JP | 2005-191344 | 7/2005 |
| JP | 2005-236121 | 9/2005 |
| JP | 2006-173295 | 6/2006 |
| JP | 2006-295151 | 10/2006 |
| WO | WO 99/49504 | 9/1999 |
| WO | WO 2004/053596 | 6/2004 |
| WO | WO 2004/053950 | 6/2004 |
| WO | WO 2004/053951 | 6/2004 |
| WO | WO 2004/053952 | 6/2004 |
| WO | WO 2004/053953 | 6/2004 |
| WO | WO 2004/053954 | 6/2004 |
| WO | WO 2004/053955 | 6/2004 |
| WO | WO 2004/053956 | 6/2004 |
| WO | WO 2004/053957 | 6/2004 |
| WO | WO 2004/053958 | 6/2004 |
| WO | WO 2004/053959 | 6/2004 |
| WO | WO 2004/055803 | 7/2004 |
| WO | WO 2004/057589 | 7/2004 |
| WO | WO 2004/057590 | 7/2004 |
| WO | WO 2004/090577 | 10/2004 |
| WO | WO 2004/090633 | 10/2004 |
| WO | WO 2004/090634 | 10/2004 |
| WO | WO 2004/092830 | 10/2004 |
| WO | WO 2004/092833 | 10/2004 |
| WO | WO 2004/093130 | 10/2004 |
| WO | WO 2004/093159 | 10/2004 |
| WO | WO 2004/093160 | 10/2004 |

(56) References Cited

FOREIGN PATENT DOCUMENTS

| WO | WO 2004/095135 | 11/2004 |
| WO | WO 2005/010611 | 2/2005 |
| WO | 2005/022615 | 3/2005 |
| WO | WO 2005/024517 | 3/2005 |
| WO | 2005/041276 | 5/2005 |
| WO | 2005/081290 | 9/2005 |
| WO | 2006/064851 | 6/2006 |

OTHER PUBLICATIONS

M. Switkes et al., "Immersion Lithography at 157 nm", J. Vac. Sci. Technol. B., vol. 19, No. 6, Nov./Dec. 2001, pp. 2353-2356.

M. Switkes et al., "Immersion Lithography: Optics for the 50 nm Node", 157 Anvers-1, Sep. 4, 2002.

B.J. Lin, "Drivers, Prospects and Challenges for Immersion Lithography", TSMC, Inc., Sep. 2002.

B.J. Lin, "Proximity Printing Through Liquid", IBM Technical Disclosure Bulletin, vol. 20, No. 11B, Apr. 1978, p. 4997.

B.J. Lin, "The Paths to Subhalf-Micrometer Optical Lithography", SPIE vol. 922, Optical/Laser Microlithography (1988), pp. 256-269.

G.W.W. Stevens, "Reduction of Waste Resulting from Mask Defects", Solid State Technology, Aug. 1978, vol. 21 008, pp. 68-72.

S. Owa et al., "Immersion Lithography; its potential performance and issues", SPIE Microlithography 2003, 5040-186, Feb. 27, 2003.

S. Owa et al., "Advantage and Feasibility of Immersion Lithography", Proc. SPIE 5040 (2003).

Nikon Precision Europe GmbH, "Investor Relations—Nikon's Real Solutions", May 15, 2003.

H. Kawata et al., "Optical Projection Lithography using Lenses with Numerical Apertures Greater than Unity", Microelectronic Engineering 9 (1989), pp. 31-36.

J.A. Hoffnagle et al., "Liquid Immersion Deep-Ultraviolet Interferometric Lithography", J. Vac. Sci. Technol. B., vol. 17, No. 6, Nov./Dec. 1999, pp. 3306-3309.

B.W. Smith et al., "Immersion Optical Lithography at 193nm", Future FAB International, vol. 15, Jul. 11, 2003.

H. Kawata et al., "Fabrication of 0.2 µm Fine Patterns Using Optical Projection Lithography with an Oil Immersion Lens", Jpn. J. Appl. Phys. vol. 31 (1992), pp. 4174-4177.

G. Owen et al., "1/8 µm Optical Lithography", J. Vac. Sci. Technol, B., vol. 10, No. 6, Nov./Dec. 1992, pp. 3032-3036.

H. Hogan, "New Semiconductor Lithography Makes a Splash", Photonics Spectra, Photonics TechnologyWorld, Oct. 2003 Edition, pp. 1-3.

S. Owa and N. Nagasaka, "Potential Performance and Feasibility of Immersion Lithography", NGL Workshop 2003, Jul. 10, 2003, Slide Nos. 1-33.

S. Owa et al., "Update on 193nm immersion exposure tool", Litho Forum, International SEMATECH, Los Angeles, Jan. 27-29, 2004, Slide Nos. 1-51.

H. Hata, "The Development of Immersion Exposure Tools", Litho Forum, International SEMATECH, Los Angeles, Jan. 27-29, 2004, Slide Nos. 1-22.

T. Matsuyama et al., "Nikon Projection Lens Update", SPIE Microlithography 2004, 5377-65, Mar. 2004.

"Depth-of-Focus Enhancement Using High Refractive Index Layer on the Imaging Layer", IBM Technical Disclosure Bulletin, vol. 27, No. 11, Apr. 1985, p. 6521.

A. Suzuki, "Lithography Advances on Multiple Fronts", EEdesign, EE Times, Jan. 5, 2004.

B. Lin, The $\kappa_3$ coefficient in nonparaxial $\lambda$/NA scaling equations for resolution, depth of focus, and immersion lithography, *J. Microlith., Microfab., Microsyst.* 1(1):7-12 (2002).

Japanese Office Action dated Jul. 3, 2012 in corresponding Japanese Patent Application No. 2011-026014.

Japanese Office Action dated Nov. 10, 2010 in related Japanese patent application No. 2007-309567.

\* cited by examiner

Fig. 2
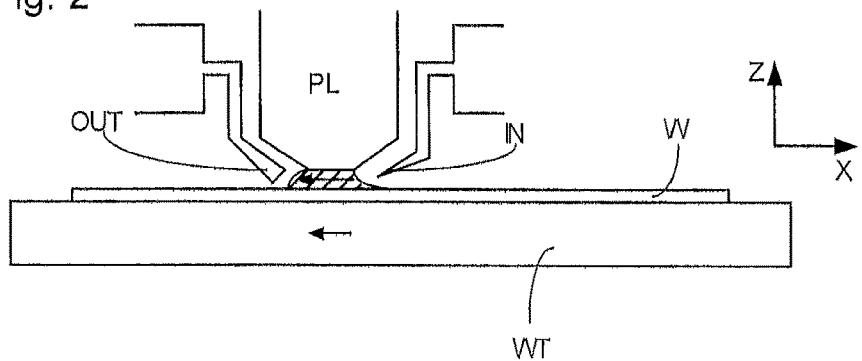
Fig. 3
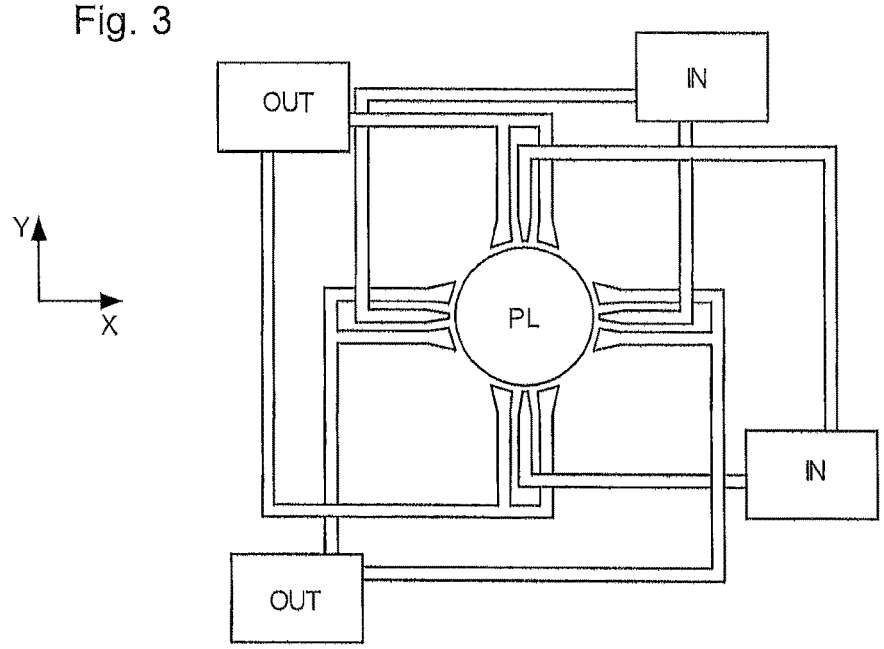
Fig. 4
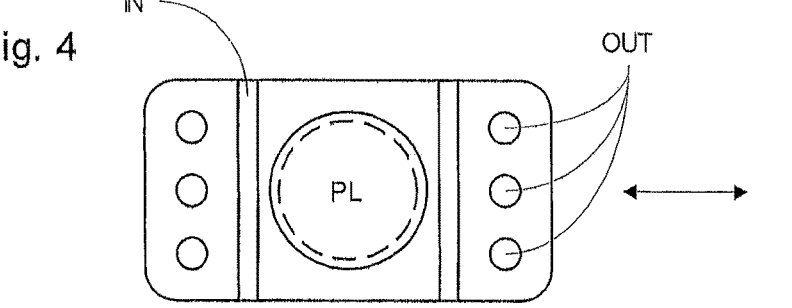
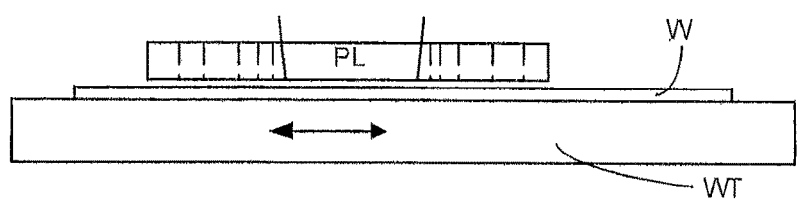

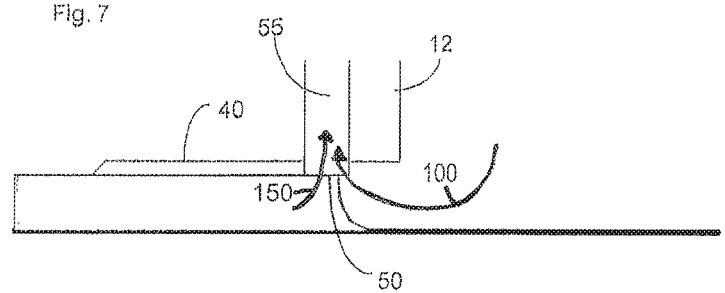
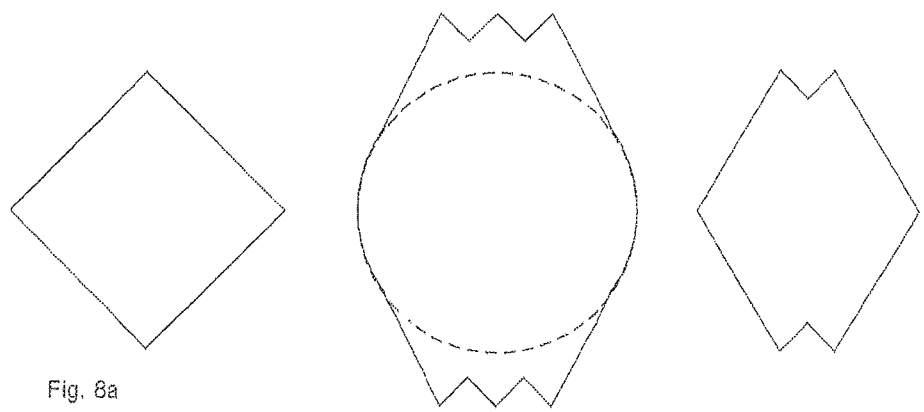
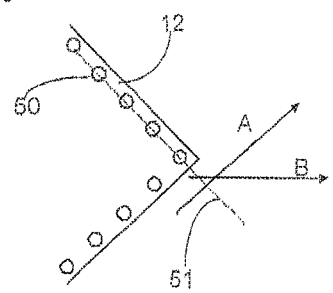
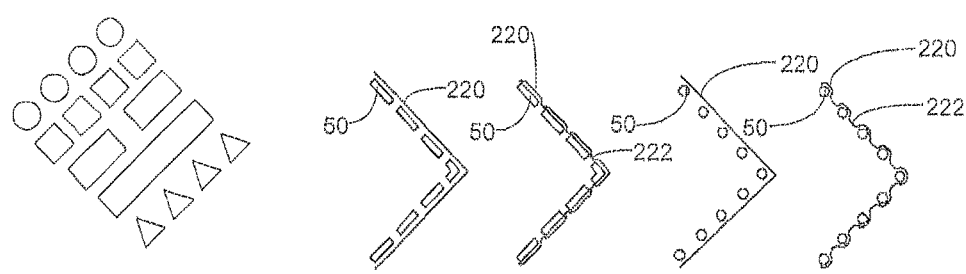
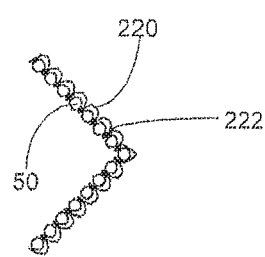

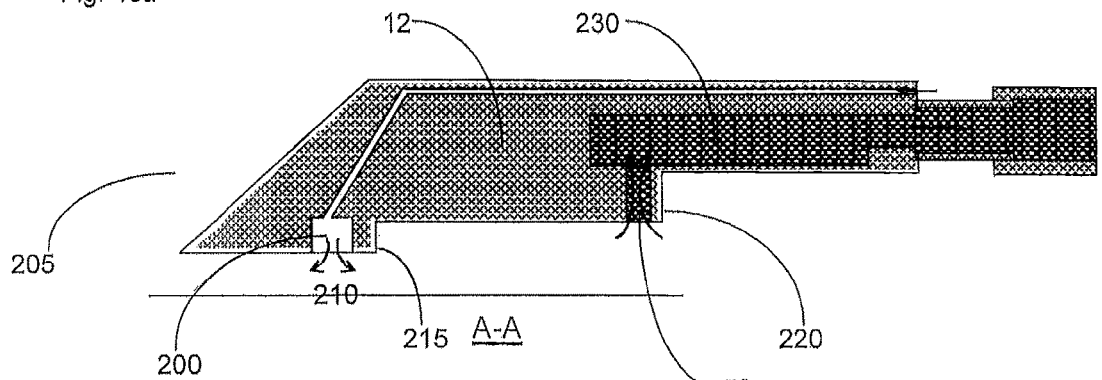
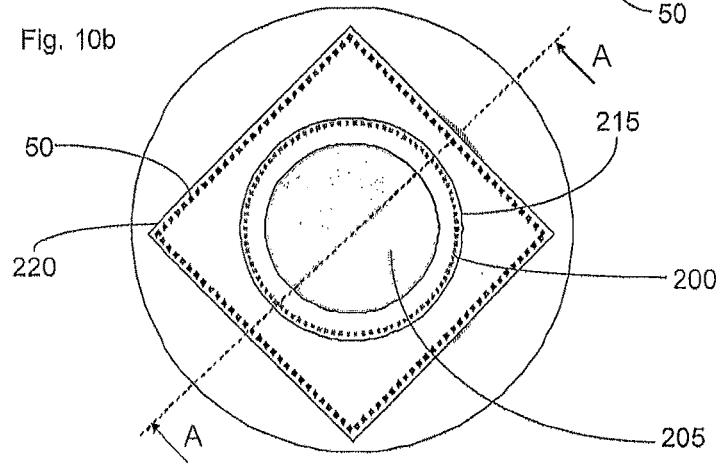
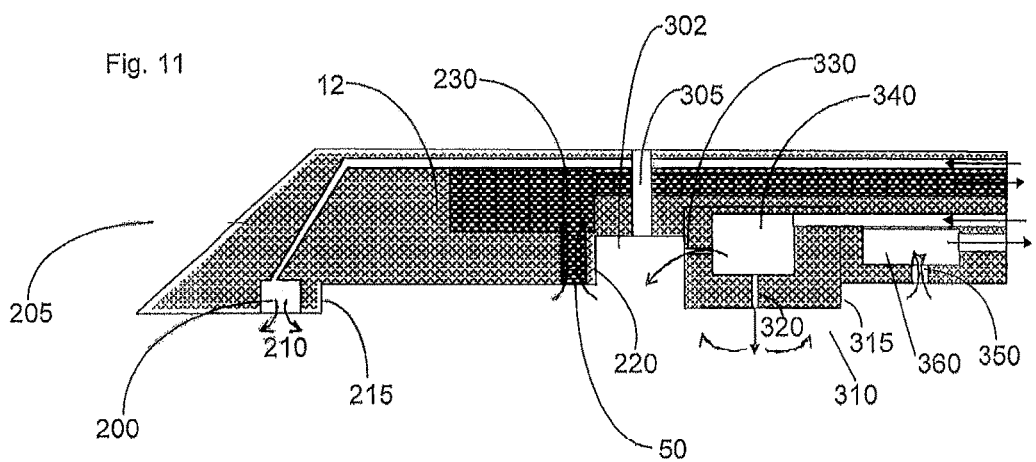

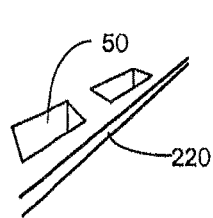
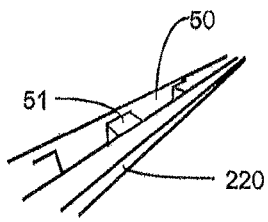
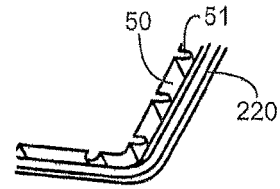
Fig. 16a          Fig. 16b          Fig. 16c
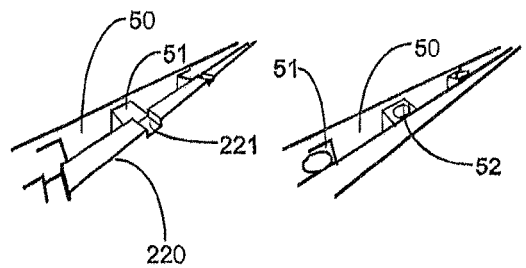
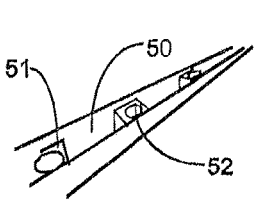
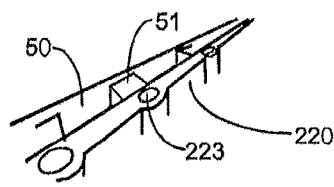
Fig. 16d          Fig. 16e          Fig. 16f
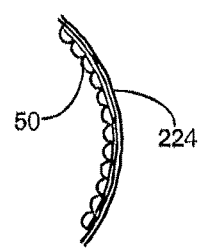
Fig. 17

LITHOGRAPHIC APPARATUS AND DEVICE MANUFACTURING METHOD

This application is continuation of U.S. patent application Ser. No. 14/106,403, filed Dec. 13, 2013, now allowed, which is a divisional of U.S. patent application Ser. No. 11/987,569, filed Nov. 30, 2007, now U.S. Pat. No. 8,634,053, which claims priority to and benefit from U.S. Provisional Patent Application No. 60/999,774, filed Dec. 7, 2006, the entire contents of each of the foregoing applications is hereby incorporated by reference.

FIELD

The present invention relates to a lithographic apparatus and a method for manufacturing a device.

BACKGROUND

A lithographic apparatus is a machine that applies a desired pattern onto a substrate, usually onto a target portion of the substrate. A lithographic apparatus can be used, for example, in the manufacture of integrated circuits (ICs). In that instance, a patterning device, which is alternatively referred to as a mask or a reticle, may be used to generate a circuit pattern to be formed on an individual layer of the IC. This pattern can be transferred onto a target portion (e.g. comprising part of, one, or several dies) on a substrate (e.g. a silicon wafer). Transfer of the pattern is typically via imaging onto a layer of radiation-sensitive material (resist) provided on the substrate. In general, a single substrate will contain a network of adjacent target portions that are successively patterned. Known lithographic apparatus include so-called steppers, in which each target portion is irradiated by exposing an entire pattern onto the target portion at one time, and so-called scanners, in which each target portion is irradiated by scanning the pattern through a radiation beam in a given direction (the "scanning"-direction) while synchronously scanning the substrate parallel or anti-parallel to this direction. It is also possible to transfer the pattern from the patterning device to the substrate by imprinting the pattern onto the substrate.

It has been proposed to immerse the substrate in the lithographic projection apparatus in a liquid having a relatively high refractive index, e.g. water, so as to fill a space between the final element of the projection system and the substrate. The point of this is to enable imaging of smaller features since the exposure radiation will have a shorter wavelength in the liquid. (The effect of the liquid may also be regarded as increasing the effective NA of the system and also increasing the depth of focus.) Other immersion liquids have been proposed, including water with solid particles (e.g. quartz) suspended therein.

However, submersing the substrate or substrate and substrate table in a bath of liquid (see, for example, U.S. Pat. No. 4,509,852 means that there is a large body of liquid that must be accelerated during a scanning exposure. This requires additional or more powerful motors and turbulence in the liquid may lead to undesirable and unpredictable effects.

One of the solutions proposed is for a liquid supply system to provide liquid on only a localized area of the substrate and in between the final element of the projection system and the substrate using a liquid confinement system (the substrate generally has a larger surface area than the final element of the projection system). One way which has been proposed to arrange for this is disclosed in PCT patent application publication WO 99/49504. As illustrated in FIGS. 2 and 3, liquid is supplied by at least one inlet IN onto the substrate, preferably along the direction of movement of the substrate relative to the final element, and is removed by at least one outlet OUT after having passed under the projection system. That is, as the substrate is scanned beneath the element in a −X direction, liquid is supplied at the +X side of the element and taken up at the −X side. FIG. 2 shows the arrangement schematically in which liquid is supplied via inlet IN and is taken up on the other side of the element by outlet OUT which is connected to a low pressure source. In the illustration of FIG. 2 the liquid is supplied along the direction of movement of the substrate relative to the final element, though this does not need to be the case. Various orientations and numbers of in- and out-lets positioned around the final element are possible, one example is illustrated in FIG. 3 in which four sets of an inlet with an outlet on either side are provided in a regular pattern around the final element.

It is desirable to be able to move the substrate as fast as possible below the projection system. For this, the liquid confinement system, if it is a localized area liquid confinement system, should be designed to strongly pin the edge of the liquid (i.e. the meniscus) in place relative to the liquid confinement system (and therefore the projection system) to allow high scanning without significant liquid loss. A simple system has obvious advantages.

SUMMARY

It is desirable, for example, to provide a liquid supply system which pins in place a meniscus of liquid in a space between the final element of the projection system and the substrate.

According to an aspect of the invention, there is provided a lithographic projection apparatus arranged to project a pattern from a patterning device onto a substrate through a liquid and comprising a liquid confinement system to at least partly confine the liquid to a space adjacent the substrate, the liquid confinement system comprising a plurality of discrete outlets arranged around the space to at least partly confine the liquid to the space by removing a mixture of (i) liquid from the space and (ii) gas from the atmosphere outside the liquid confinement system.

According to an aspect of the invention, there is provided a lithographic projection apparatus having a projection system to project a pattern from a patterning device onto a substrate, the apparatus comprising a liquid confinement structure to at least partly confine a liquid to a space between the projection system and the substrate, the liquid confinement structure comprising a plurality of outlets configured to remove liquid from the space and gas from outside the space to substantially pin a meniscus of the liquid in the space due to the creation of a gas flow.

According to an aspect of the invention, there is provided a device manufacturing method comprising projecting a patterned beam of radiation onto a substrate through a liquid provided in a space adjacent the substrate, and containing the liquid in the space at least in part by pinning a meniscus of the liquid between adjacent outlets using a gas flow generated by extraction of gas, from outside of the space, through the outlets.

BRIEF DESCRIPTION OF THE DRAWINGS

Embodiments of the invention will now be described, by way of example only, with reference to the accompanying schematic drawings in which corresponding reference symbols indicate corresponding parts, and in which:

FIGS. 2 and 3 depict a liquid supply system for use in a lithographic projection apparatus;

FIG. 4 depicts a further liquid supply system for use in a lithographic projection apparatus;

FIG. 7 depicts, in cross-section in a plane substantially parallel to the optical axis of the projection system, a meniscus pinning system according to an embodiment of the present invention;

FIG. 8 illustrates, in plan, a further liquid confinement system according to an embodiment of the present invention;

FIG. 9 illustrates various different embodiments of outlets according to an embodiment of the present invention;

FIGS. 10a and FIG. 10b illustrate a further embodiment of a liquid confinement structure in cross-section and plan respectively;

FIG. 11 illustrates, in cross-section, a further embodiment of a liquid confinement structure;

FIG. 16a, FIG. 16b, FIG. 16c, FIG. 16d, FIG. 16e and FIG. 16f illustrate, in perspective view, different embodiments of outlet, step change in height and inlet; and FIG. 17 illustrates, in plan, a configuration of outlet and inlet.

DETAILED DESCRIPTION

Figure 1:
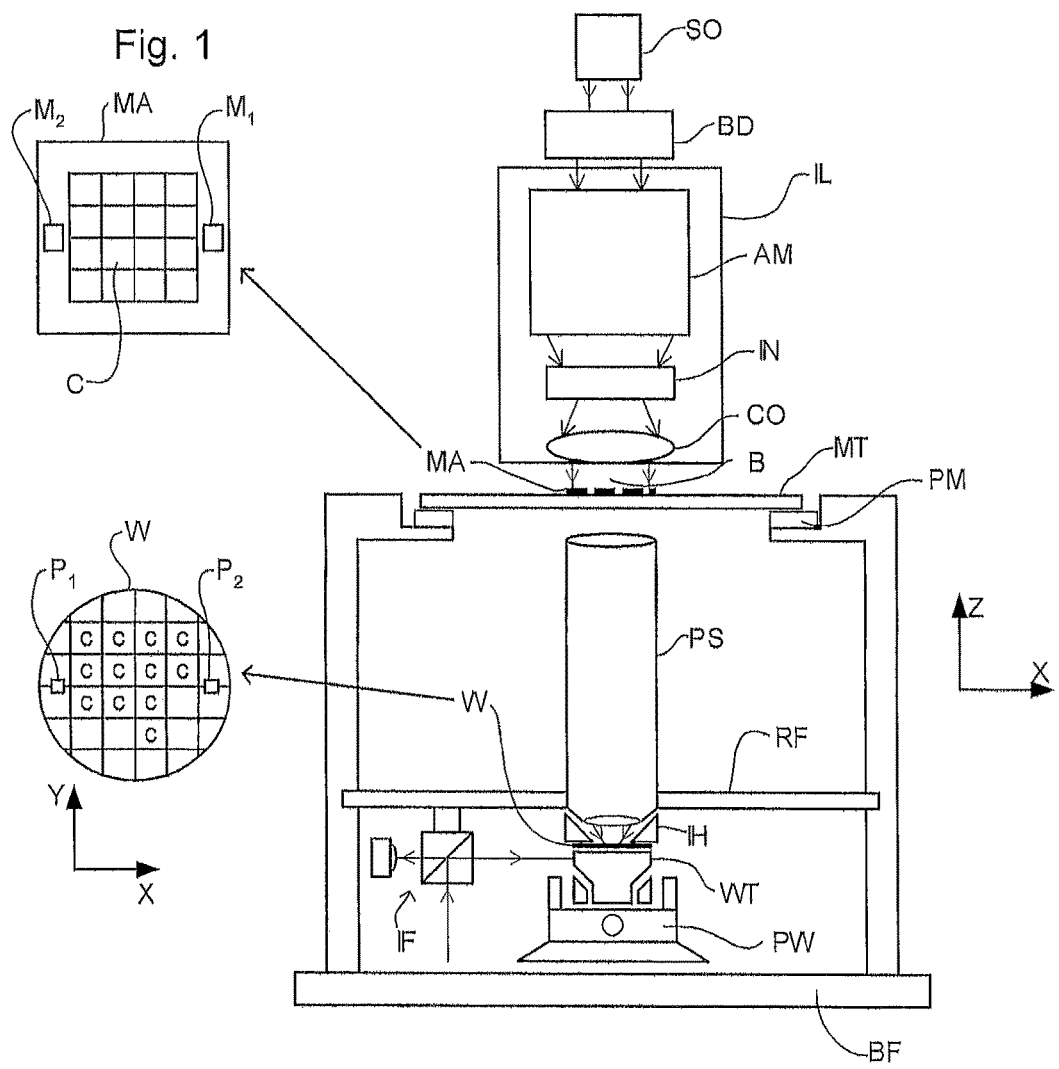
FIG. 1 depicts a lithographic apparatus according to an embodiment of the invention.

FIG. 1 schematically depicts a lithographic apparatus according to one embodiment of the invention. The apparatus comprises:

- an illumination system (illuminator) IL configured to condition a radiation beam B (e.g. UV radiation or DUV radiation);
- a support structure (e.g. a mask table) MT constructed to support a patterning device (e.g. a mask) MA and connected to a first positioner PM configured to accurately position the patterning device in accordance with certain parameters;
- a substrate table (e.g. a wafer table) WT constructed to hold a substrate (e.g. a resist-coated wafer) W and connected to a second positioner PW configured to accurately position the substrate in accordance with certain parameters; and
- a projection system (e.g. a refractive projection lens system) PS configured to project a pattern imparted to the radiation beam B by patterning device MA onto a target portion C (e.g. comprising one or more dies) of the substrate W.

The illumination system may include various types of optical components, such as refractive, reflective, magnetic, electromagnetic, electrostatic or other types of optical components, or any combination thereof, for directing, shaping, or controlling radiation.

The support structure holds the patterning device in a manner that depends on the orientation of the patterning device, the design of the lithographic apparatus, and other conditions, such as for example whether or not the patterning device is held in a vacuum environment. The support structure can use mechanical, vacuum, electrostatic or other clamping techniques to hold the patterning device. The support structure may be a frame or a table, for example, which may be fixed or movable as required. The support structure may ensure that the patterning device is at a desired position, for example with respect to the projection system. Any use of the terms "reticle" or "mask" herein may be considered synonymous with the more general term "patterning device."

The term "patterning device" used herein should be broadly interpreted as referring to any device that can be used to impart a radiation beam with a pattern in its cross-section such as to create a pattern in a target portion of the substrate. It should be noted that the pattern imparted to the radiation beam may not exactly correspond to the desired pattern in the target portion of the substrate, for example if the pattern includes phase-shifting features or so called assist features. Generally, the pattern imparted to the radiation beam will correspond to a particular functional layer in a device being created in the target portion, such as an integrated circuit.

The patterning device may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions. The tilted mirrors impart a pattern in a radiation beam which is reflected by the mirror matrix.

The term "projection system" used herein should be broadly interpreted as encompassing any type of projection system, including refractive, reflective, catadioptric, magnetic, electromagnetic and electrostatic optical systems, or any combination thereof, as appropriate for the exposure radiation being used, or for other factors such as the use of an immersion liquid or the use of a vacuum. Any use of the term "projection lens" herein may be considered as synonymous with the more general term "projection system".

As here depicted, the apparatus is of a transmissive type (e.g. employing a transmissive mask). Alternatively, the apparatus may be of a reflective type (e.g. employing a programmable mirror array of a type as referred to above, or employing a reflective mask).

The lithographic apparatus may be of a type having two (dual stage) or more substrate tables (and/or two or more support structures). In such "multiple stage" machines the additional tables and/or support structures may be used in parallel, or preparatory steps may be carried out on one or more tables and/or support structures while one or more other tables and/or support structures are being used for exposure.

Referring to FIG. 1, the illuminator IL receives a radiation beam from a radiation source SO. The source and the lithographic apparatus may be separate entities, for example when the source is an excimer laser. In such cases, the source is not considered to form part of the lithographic apparatus and the radiation beam is passed from the source SO to the illuminator IL with the aid of a beam delivery system BD comprising, for example, suitable directing mirrors and/or a beam expander. In other cases the source may be an integral part of the lithographic apparatus, for example when the source is a mercury lamp. The source SO and the illuminator IL, together with the beam delivery system BD if required, may be referred to as a radiation system.

The illuminator IL may comprise an adjuster AD for adjusting the angular intensity distribution of the radiation beam. Generally, at least the outer and/or inner radial extent (commonly referred to as σ-outer and σ-inner, respectively) of the intensity distribution in a pupil plane of the illuminator can be adjusted. In addition, the illuminator IL may comprise various other components, such as an integrator IN and a condenser CO. The illuminator may be used to condition the radiation beam, to have a desired uniformity and intensity distribution in its cross-section.

The radiation beam B is incident on the patterning device (e.g., mask) MA, which is held on the support structure (e.g., mask table) MT, and is patterned by the patterning device. Having traversed the patterning device MA, the radiation beam B passes through the projection system PS, which focuses the beam onto a target portion C of the substrate W. With the aid of the second positioner PW and position sensor IF (e.g. an interferometric device, linear encoder or capacitive sensor), the substrate table WT can be moved accurately, e.g. so as to position different target portions C in the path of the radiation beam B. Similarly, the first positioner PM and another position sensor (which is not explicitly depicted in FIG. 1) can be used to accurately position the patterning device MA with respect to the path of the radiation beam B, e.g. after mechanical retrieval from a mask library, or during a scan. In general, movement of the support structure MT may be realized with the aid of a long-stroke module (coarse positioning) and a short-stroke module (fine positioning), which form part of the first positioner PM. Similarly, movement of the substrate table WT may be realized using a long-stroke module and a short-stroke module, which form part of the second positioner PW. In the case of a stepper (as opposed to a scanner) the support structure MT may be connected to a short-stroke actuator only, or may be fixed. Patterning device MA and substrate W may be aligned using patterning device alignment marks M1, M2 and substrate alignment marks P1, P2. Although the substrate alignment marks as illustrated occupy dedicated target portions, they may be located in spaces between target portions (these are known as scribe-lane alignment marks). Similarly, in situations in which more than one die is provided on the patterning device MA, the patterning device alignment marks may be located between the dies.

The depicted apparatus could be used in at least one of the following modes:

1. In step mode, the support structure MT and the substrate table WT are kept essentially stationary, while an entire pattern imparted to the radiation beam is projected onto a target portion C at one time (i.e. a single static exposure). The substrate table WT is then shifted in the X and/or Y direction so that a different target portion C can be exposed. In step mode, the maximum size of the exposure field limits the size of the target portion C imaged in a single static exposure.

2. In scan mode, the support structure MT and the substrate table WT are scanned synchronously while a pattern imparted to the radiation beam is projected onto a target portion C (i.e. a single dynamic exposure). The velocity and direction of the substrate table WT relative to the support structure MT may be determined by the (de-)magnification and image reversal characteristics of the projection system PS. In scan mode, the maximum size of the exposure field limits the width (in the non-scanning direction) of the target portion in a single dynamic exposure, whereas the length of the scanning motion determines the height (in the scanning direction) of the target portion.

3. In another mode, the support structure MT is kept essentially stationary holding a programmable patterning device, and the substrate table WT is moved or scanned while a pattern imparted to the radiation beam is projected onto a target portion C. In this mode, generally a pulsed radiation source is employed and the programmable patterning device is updated as required after each movement of the substrate table WT or in between successive radiation pulses during a scan. This mode of operation can be readily applied to maskless lithography that utilizes programmable patterning device, such as a programmable mirror array of a type as referred to above.

Combinations and/or variations on the above described modes of use or entirely different modes of use may also be employed.

An embodiment of the present invention will be described herein with reference to liquid. However, another fluid may be suitable, particularly a wetting fluid, an incompressible fluid and/or a fluid with higher refractive index than air, desirably a higher refractive index than water. In an embodiment, the liquid is distilled water, although another liquid can be used.

A further immersion lithography solution with a localized liquid supply system is shown in FIG. 4. Liquid is supplied by two groove inlets IN on either side of the projection system PL and is removed by a plurality of discrete outlets OUT arranged radially outwardly of the inlets IN. The inlets IN and OUT can be arranged in a plate with a hole in its center and through which the projection beam is projected. Liquid is supplied by one groove inlet IN on one side of the projection system PL and removed by a plurality of discrete outlets OUT on the other side of the projection system PL, causing a flow of a thin film of liquid between the projection system PL and the substrate W. The choice of which combination of inlet IN and outlets OUT to use can depend on the direction of movement of the substrate W (the other combination of inlet IN and outlets OUT being inactive).

Figure 5:
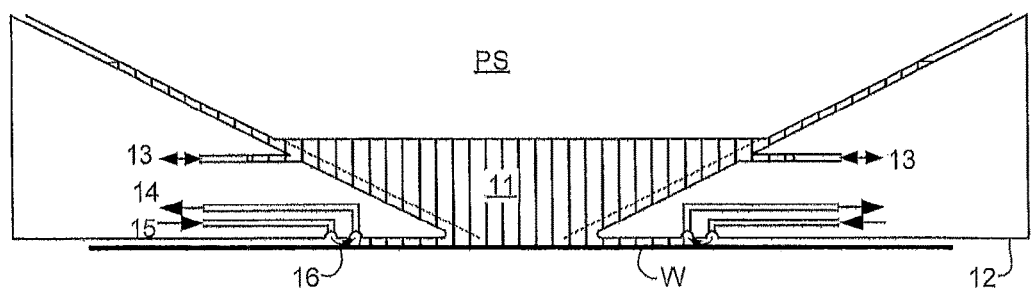
FIG. 5 depicts a further liquid supply system for use in a lithographic projection apparatus.

Another immersion lithography solution with a localized liquid supply system solution which has been proposed is to provide the liquid supply system with a liquid confinement structure which extends along at least a part of a boundary of the space between the final element of the projection system and the substrate table. Such a solution is illustrated in FIG. 5. The liquid confinement structure is substantially stationary relative to the projection system in the XY plane though there may be some relative movement in the Z direction (in the direction of the optical axis). In an embodiment, a seal is formed between the liquid confinement structure and the surface of the substrate and may be a contactless seal such as a gas seal.

The liquid confinement structure 12 at least partly contains liquid in the space 11 between a final element of the projection system PL and the substrate W. A contactless seal 16 to the substrate may be formed around the image field of the projection system so that liquid is confined within the space between the substrate surface and the final element of the projection system. The space is at least partly formed by the liquid confinement structure 12 positioned below and surrounding the final element of the projection system PL. Liquid is brought into the space below the projection system and within the liquid confinement structure 12 by liquid inlet 13 and may be removed by liquid outlet 13. The liquid confinement structure 12 may extend a little above the final element of the projection system and the liquid level rises above the final element so that a buffer of liquid is provided. The liquid confinement structure 12 has an inner periphery that at the upper end, in an embodiment, closely conforms to the shape of the projection system or the final element thereof and may, e.g., be round. At the bottom, the inner periphery closely conforms to the shape of the image field, e.g., rectangular though this need not be the case.

The liquid is contained in the space 11 by a gas seal 16 which, during use, is formed between the bottom of the liquid confinement structure 12 and the surface of the substrate W. The gas seal is formed by gas, e.g. air or synthetic air but, in an embodiment. $N_2$ or another inert gas, provided under pressure via inlet 15 to the gap between liquid confinement structure 12 and substrate and extracted via outlet 14. The overpressure on the gas inlet 15, vacuum level on the outlet 14 and geometry of the gap are arranged so that there is a high-velocity gas flow inwards that confines the liquid. Those inlets/outlets may be annular grooves which surround the space 11 and the flow of gas 16 is effective to contain the liquid in the space 11. Such a system is disclosed in United States patent application publication no. US 2004-0207824, hereby incorporated in its entirety by reference.

In European patent application publication no. EP 1420300 and United States patent application publication no. US 2004-0136494, each hereby incorporated in their entirety by reference, the idea of a twin or dual stage immersion lithography apparatus is disclosed. Such an apparatus is provided with two tables for supporting a substrate. Leveling measurements are carried out with a table at a first position, without immersion liquid, and exposure is carried out with a table at a second position, where immersion liquid is present. Alternatively, the apparatus has only one table.

An embodiment of the present invention is an improvement on the liquid supply system IH illustrated in FIGS. 1 and 5 (although it may be applied to any other appropriate liquid supply system). As noted above, in the liquid supply system of FIG. 5 liquid is held in a space 11 between the substrate W and a final element of the projection system PS. A liquid confinement structure 12 surrounds space 11 to which liquid is provided. Liquid can be provided in any way. In the embodiment of FIG. 5, liquid is supplied through an inlet 13. A seal is made between the liquid confinement structure 12 and the substrate W using a gas flow 16. Gas leaves an inlet 15 and is withdrawn along with immersion liquid through an outlet 14. The flow of gas illustrated by the arrow pins, substantially in place, the meniscus of the liquid at an edge of the space 11.

In the embodiment of FIG. 5, the inlet 15 and outlet 14 are annular and the seal formed by the gas flow 16 breaks down at relatively low scan speeds. An embodiment of the present invention addresses this problem.

Figure 6:
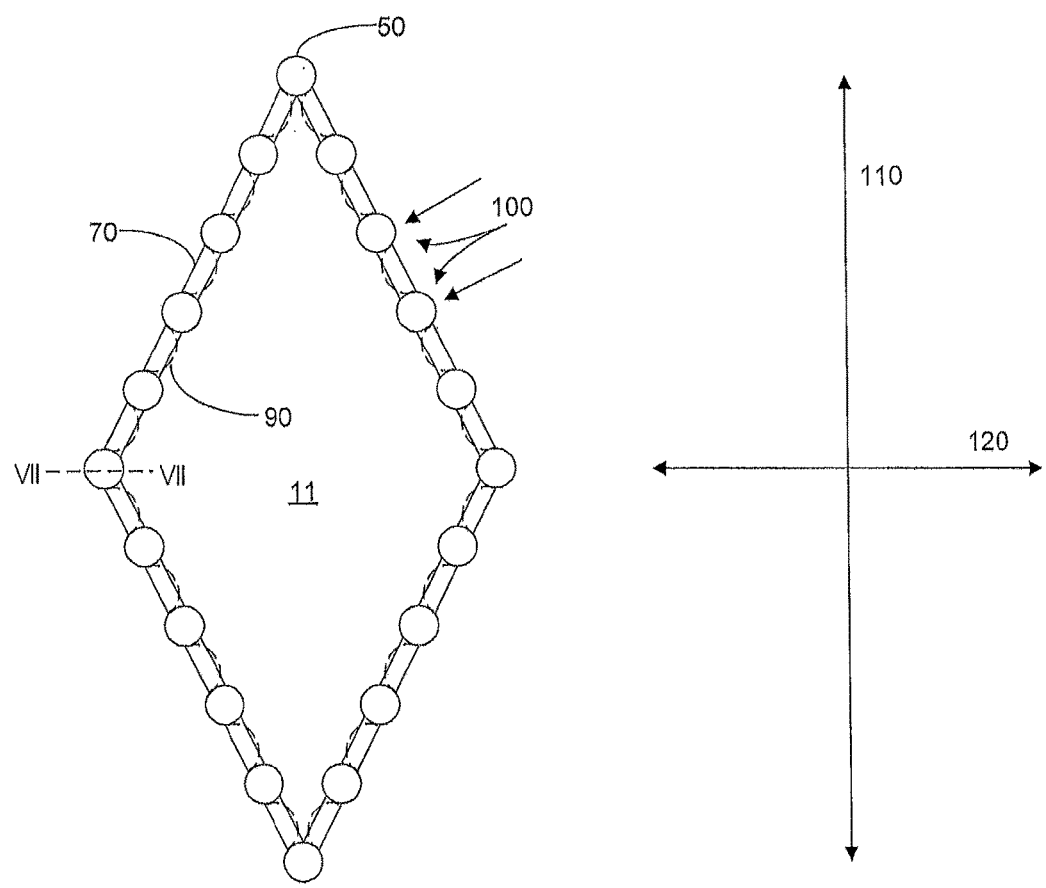
FIG. 6 illustrates, in plan, a meniscus pinning system according to an embodiment of the present invention.

FIG. 6 illustrates the meniscus pinning device of an embodiment of the present invention which may, for example, replace the meniscus pinning arrangement 14, 15, 16 of FIG. 5. The meniscus pinning device of FIG. 6 comprises a plurality of discrete outlets 50. Each of these outlets 50 are illustrated as being circular though this is not necessarily the case. Indeed one or more of the outlets may be one or more selected from a square, rectangular, oblong, triangular, an elongate slit, etc. Some example shapes are given in FIG. 9. Each outlet has, in plan, a large width (e.g., a diameter), perhaps with a maximum dimension of greater than 0.2 mm, or greater than 0.5 mm or greater than 1 mm. Thus, the outlets 50 are unlikely to be effected much by contamination.

Each of the outlets 50 of the meniscus pinning device of FIG. 6 may be connected to a separate under pressure source. Alternatively or additionally, each or a plurality of the outlets 50 may be connected to a common chamber (which may be annular) which is itself held at an under pressure. In this way a uniform under pressure at each or a plurality of the outlets may be achieved. The outlets 50 can be connected to a vacuum source and/or the atmosphere surrounding the liquid supply system may be increased in pressure to generate the required underpressure.

A ridge 70 may be provided between adjacent outlets 50. As can be seen from FIG. 7, which is a cross-section through lines VII-VII in FIG. 6, the outlet 50 is formed as a protrusion from the bottom surface 40 of the liquid confinement structure 12 (i.e., the bottom surface of the outlet 50 is displaced in the vertical direction from the bottom surface 40). The ridge 70 is positioned at the same height or protrudes by the same amount or less from the surface of the liquid confinement structure 12 as the outlet 50. The outlet 50 is an outlet of a tube or elongate passageway 55, for example. Desirably the outlet is positioned such that it faces the substrate and is substantially parallel to a top surface of the substrate. Another way of thinking of this is that an elongate axis of the passageway 55 to which the outlet 50 is connected is substantially perpendicularly (within +/−45°, desirably within 35°, 25° or even 15° from perpendicular) to the top surface of the substrate W.

Each outlet 50 is designed to extract a mixture of liquid and gas. The liquid is extracted from the space 11 whereas the gas is extracted from the atmosphere on the other side of the outlets 50 and ridges 70 to the liquid. This creates a gas flow as illustrated by arrows 100 and this gas flow is effective to pin the meniscus 90 between the outlets 50 substantially in place as illustrated in FIG. 6. The gas flow helps maintain the liquid confined by momentum blocking, by a gas flow induced pressure gradient and/or by drag (shear) of the gas flow on the liquid.

As can be seen from FIG. 6, the outlets and ridges are positioned so as to form, in plan, a polygonal shape. In the case of FIG. 6 this is in the shape of a rhombus with the principal axes 110, 120 aligned with the major directions of travel of the substrate W under the projection system. This helps ensure that the maximum scan speed is faster than if the outlets and ridges 70 were arranged in a circular shape. This is because the force on the meniscus between two outlets is reduced with a factor cos θ, where θ is the angle of the line connecting the two outlets relative to the direction in which the substrate W is moving. Thus, throughput can be optimized by making the primary axis 110 of the shape of the outlets aligned with the major direction of travel of the substrate (usually the scan direction) and to have a second axis 120 aligned with the other major direction of travel of the substrate (usually the step direction). It will be appreciated that any arrangement in which θ is different to 90° will give an advantage. Thus, exact alignment of the principal axes with the major directions of travel is not vital. It will further be appreciated that if the shape is circular, then there will always be two outlets 50 which are aligned perpendicularly to the direction of travel so that the meniscus between those two outlets receives the maximum available force by movement of the substrate W. From the above, it can be seen that even the use of a square shape with the sides aligned at about 45° to the principal directions of travel of the substrate gives a great benefit. The ratio of the major dimension of a square to the minor dimension is √2:1 and any shapes with such a ratio of greater than 1.2:1 are particularly suitable. For shapes with two principal axes, a length ratio of between 4/9 and 8/9, desirably between 5/9 and 7/9 may be particularly suitable bearing in mind the amount and speed of movement in the step and scan directions. In an embodiment, each of the outlets is, in plan, spaced apart from each other between 0.25 and 10 times their maximum plan dimension. In an embodiment, the outlets, in plan, have an aspect ratio of between 1 and 0.05.

FIG. 7 illustrates that the outlet 50 is provided in a protrusion from the bottom surface 40 of the liquid confinement structure 12. This is however not necessarily the case and the outlets 50 may be in the major bottom surface of the liquid confinement structure 12. In this case the liquid will abut the major bottom surface and thus not have a free top surface which is prone to the undesirable generation of waves. In this case there is no definable ridge 70. Arrow 100 shows the flow of gas from outside of the liquid confinement structure 12 into the passageway 55 associated with the outlet 50 and the arrow 150 illustrates the passage of liquid from the space into the outlet 50. The passageway 55 and outlet 50 are designed so that two phase extraction (i.e. gas and liquid) occurs in an annular flow mode in which gas substantially flows through the center of the passageway 55 and liquid substantially flows along the walls of the passageway 55. This results in smooth flow with low generation of pulsations.

In FIG. 7, the level of liquid is arranged such that it does not touch the bottom surface 40 of the liquid confinement structure 12 even radially inwardly of the outlets 50. As discussed above, that is however not necessarily the case. There are no meniscus pinning features radially inwardly of the outlets 50 and neither are there any other components or meniscus pinning features radially outwardly of the outlets 50. Thus, in comparison to the liquid confinement system of FIG. 5, there is no gas inlet 15 or equivalent and the outlet 14 has been split into several discrete outlets 50 each connected to, e.g., an under pressure source. The meniscus is pinned between the outlets 50 with drag forces induced by gas flow into the outlets 50. A gas drag velocity of greater than about 15 m/s, desirably 20 m/s is sufficient. By avoiding the need for a gas knife, the amount of evaporation of liquid from the substrate may be reduced thereby reducing both splashing of liquid as well as thermal expansion/contraction effects.

At least thirty-six (36) discrete needles each with a diameter of 1 mm and separated by 3.9 mm may be effective to pin a meniscus. The total gas flow in such a system is of the order of 100 l/min.

FIG. 8 shows, in plan, other geometries of arrangements of outlets which may be possible. These include a square and a variant on a circle (shown in dotted lines) in which extensions at the top and bottom have been added which have the desired angle relative to the principal direction of travel. This design could be further modified to include similar extension for the other principal direction of travel. These shapes can be regarded as part stars, part circles. A complete star shape would also work well. The final example is similar to the circle/star embodiment, but comprises all straight lines. FIG. 8a shows the detail of a corner of the square embodiment. The outlets 50 are lined up along an imaginary straight line 51 which connects the outlets 50. An edge of the liquid confinement structure 12 is also illustrated. For a scan in direction A there is no benefit but for a scan in direction B (which direction is at 45° to the line 51 connecting the outlets 50), a substantial advantage is achieved as described above.

FIG. 9 illustrates some potential shapes of outlets and different spacings between the individual outlets. Also illustrated are some typical shapes (slots and tubes) around an area where the arrangement of outlets 50 turns a corner. In FIG. 9, the configuration of a step change in height 220 is illustrated. This is described in more detail with reference to FIGS. 10-12 below. As shown, the step change in height 220 may be a substantially straight line running substantially parallel to the line along which the outlets 50 are arranged. Alternatively, the step change in height 220 may not be straight. For example, as illustrated, there may be indentations 222 between individual outlets 50. At the indentations, the step change in height 220 is closer to the line along which the outlets 50 are arranged than elsewhere.

A difficulty with the outlet 50 is that the suction towards the substrate table WT generated by the under pressure in the outlet 50 may deform the substrate table WT. One way of dealing with this is to provide a further opening radially outwardly of the outlets. The further opening is open to ambient pressure $P_{amb}$. This limits the under pressure generated between the liquid confinement structure 12 and the substrate table WT and also helps ensure that enough gas is available for the desired flow through the outlet 50. A gas knife can be provided radially outwardly of the further opening. Typically a gas knife has a gas flow of about 100 liters/minute. About 50 per cent of that gas moves radially inwardly and about 50 per cent moves radially outwardly. On the other hand, the flow of gas desired through outlet 50 can be as high as 70 liters/minute so that an additional 30 liters/minute of gas is needed. This additional gas can be provided by the further opening. The further opening may be in the form of a slit (i.e. in the form of a continuous groove) and/or a plurality of discrete holes. The discrete holes may be, for example, apertures or tubes. Additionally or alternatively, between about 25 and 75% of the gas from the gas knife may move radially inwardly and between about 25 and 75% of the gas can move radially outwardly. For instance, about 25% of the gas can move radially inwardly and about 75% radially outwardly or about 75% of the gas can move radially inwardly and about 25% can move radially outwardly.

In some instances the liquid confinement structure 12 is provided with a liquid inlet in a bottom surface which, in use, faces the substrate W. Such an arrangement is illustrated in FIG. 10a in which the liquid inlet 200 is present in the bottom surface of the liquid confinement structure 12. Thus, a flow of liquid 210 is provided down towards the substrate. Such a flow of liquid is useful in filling the gap between an edge of the substrate W and the substrate table WT. This flow of liquid is useful in reducing the inclusion of bubbles from the gap between the substrate W and substrate table WT when the edge of the substrate W passes under the liquid confinement structure 12. This feature is described in more detail in United States patent application publication no. US 2007-0081140. If such a supply of liquid is used, this can help prevent damage in the event of loss of control of the apparatus. With a large under pressure being applied to outlet 50 without measures being taken, a loss of control of the height actuator of the liquid confinement structure 12 could result in the liquid confinement structure 12 colliding into the substrate W or substrate table WT with a large force. If the aforementioned liquid supply which supplies liquid in a direction towards the substrate W is provided, this can form a liquid bearing and help protect the system from accidental loss of control (at least to some extent). The aforementioned liquid supply can also fulfill its main function of reducing bubble inclusion during imaging of the edge of a substrate W. As can be seen from FIG. 10a, the outlet 50 is connected to an under pressure via a chamber 230. The presence of the chamber 230 helps in reducing pressure fluctuations.

FIG. 10b is a view, in plan, of the liquid confinement structure 12. The liquid confinement structure 12 is circular, as is the central opening 205. The central opening 205 is circular to accommodate the circular projection system PS. The liquid outlet 200 is also circular, as is the step change in height 215 above the substrate radially outward of the liquid outlet 200. Outlets 50 are arranged, in plan, radially outwardly of the liquid outlet 200 in a square shape. Any shape such as, or other than, circular may be used, as described elsewhere. The step change in height 220 radially outward of the outlets 50 is also square. The step change in height 220 is uniformly distant, in plan, from the outlets 50. The step change in height 220 is desirably, in plan, between 0.2 and 10.0 mm from the center of the outlets 50. At the step changes in height 215, 220, there is a step change in the distance of a surface of the liquid confinement structure 12 closest to the substrate W.

One way of controlling the under pressure applied to the outlet 50 is by controlling a suction pump to achieve a certain gas flow rate. Such control is particularly suitable during start up but has a disadvantage that if the liquid confinement structure 12 for any reason moves closer to the substrate W or substrate table WT then the under pressure generated by the outlet 50 increases. This may be particularly unfavorable in the event of loss of control. Furthermore, the performance of the actuator controlling the position of the liquid confinement structure 12 may suffer as a result from such intrinsic non-linear behavior. One way of circumventing this problem is to connect the outlet 50 to an under pressure source of a fixed pressure. In that way the extraction pressure is substantially independent of the size of the gap between the bottom of the liquid confinement structure 12 and the top surface of the substrate W so that machine safety issues may be reduced or minimized. In a hybrid system, a pump attached to the outlet 50 can be controlled on start up to reach a predetermined flow rate and for normal use can be controlled to achieve a certain under pressure.

FIG. 11 shows a further embodiment which is the same as the embodiment of FIGS. 10a and b except as described below. In FIG. 11 all of the features illustrated are, in plan, circular. Therefore, no plan illustration is given. However, it will be clear that it is possible that the configuration of the outlet 50 may also be a square or rhombus or another shape as described elsewhere, as in the FIG. 10b embodiment.

In FIG. 11, there are active components of the liquid confinement structure radially outward of the step change in height 220. A recess 302 is formed radially outwardly of the outlet 50. The recess 302 has an inner wall defined by the wall making the step change in height 220 and an outer wall defined by a (substantially vertical) wall of a gas knife 310. The pressure of gas in the recess 302 is maintained at a certain pressure. This is achieved by providing a conduit, e.g. a chimney 305, which is open to a gas reservoir at the certain pressure. In an embodiment the certain pressure may be a constant and is, for example, atmospheric pressure. This leads to good functioning of the gas knife 310 and does not add significantly to the force towards the substrate on the liquid confinement structure 12.

Because the outlet 50 will extract gas from the recess 302, gas is provided to the recess via two mechanisms. The first of these is from an inlet 320 of the gas knife 310. The inlet 320 directs gas at high velocity and with a relatively narrow width towards the substrate W. This gas will move radially inwardly and outwardly after impinging on the substrate W. Upstream of the inlet 320 is a chamber 340 which is provided with humidified gas. As well as the inlet 320 which forms the gas knife from the chamber 340 there is also a further inlet 330. The further inlet 330 directs the humidified gas from the chamber 340 into the recess 302. These features allow the gas flow into the outlet 50 to be chosen independently of gas flow out of gas knife 310. If all of the gas out of gas knife 310 is extracted by the outlet 50, the function of the gas knife would be compromised and a deep under pressure over a large bottom area of the liquid confinement structure would be the consequence. This would result in unstable control of the liquid confinement structure 12 because of a large attractive force towards the substrate. This may result in substrate or substrate table deformation. Therefore further gas is provided through inlet 330. For example, if about 50% of the gas flow of inlet 320 moves radially inwardly that would be about 40 liters per minute. However, in order for the outlet 50 properly to pin the meniscus, a flow rate of about 100 liters per minute through the outlet 50 is desired. The shortage of flow can be supplied through the inlet 330. For example, the flow of gas through inlet 330 can be about 60 liters per minute. There will be a difference in the supply of gas out of inlets 320, 330. This difference will be compensated by the flow through the conduit 305. However, the gas flow through conduit 305 will remain limited such that there will be negligible flow induced pressure differences in the recess 302.

As can be seen in FIG. 11, the surface through which the inlet 320 of the gas knife 310 emerges is at a distance from the substrate greater than the surface in which the liquid inlet 200 is formed. The surface through which the inlet 320 passes is closer to the substrate than the surface through which the outlet 50 passes. There is a step change in height 315 going from the gas knife 310 to the surface through which the outer outlet 350 exits the liquid confinement structure 12.

Radially outwardly of the gas knife 310 is a further outlet 350. This outlet removes gas from radially outwardly of the liquid confinement structure 12 as well gas exiting the outlet of the gas knife 310. A chamber 360 is provided downstream of the outlet 350 to regulate pressure. The chamber 360 is connected to an under pressure source.

An advantage of having an outlet 350 is that it extracts gas from the inlet 320. This reduces the flow of gas out of inlet 320 into the environment outside the liquid confinement structure. The flow of gas out of inlet 320 has a different temperature and humidity to gas in that environment. This may cause a change in the refractive index of that environment and this may hinder a measurement system in the apparatus which is sensitive to the index of refraction of that environment. One such system is an interferometer system that measures the position of the substrate table.

Figure 12:
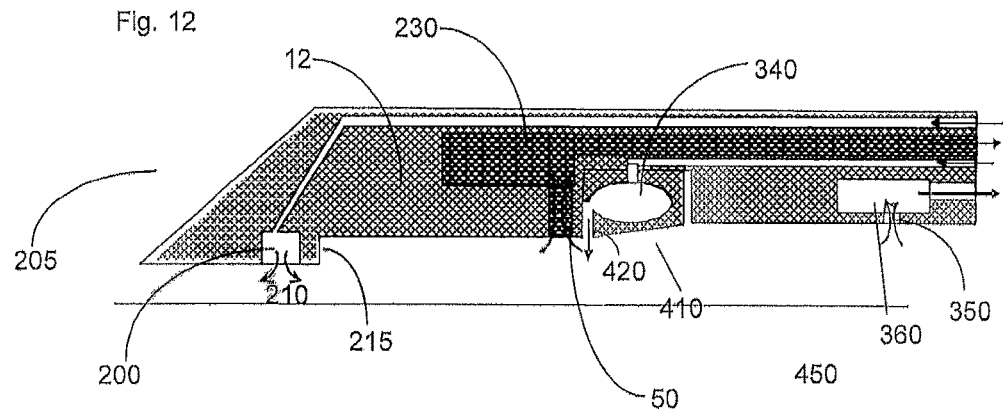
FIG. 12 illustrates, in cross-section, a further embodiment of a liquid confinement structure.

FIG. 12 illustrates a further embodiment of a liquid confinement structure. This embodiment is the same as the FIG. 11 embodiment except as described below.

In the FIG. 12 embodiment the step change in height 220 is not present. Instead a gas knife 410 is provided with an outlet 420 which is positioned adjacent or next to the outlet 50. This can increase the gas velocity at the base of the meniscus and thereby help stabilize the meniscus. That is, the inlet 420 of the gas knife 410 is positioned immediately radially outwardly of the outlet 50. For example, a distance between the center of the outlet 50 and the center of the inlet 420 is in the range of 0.2 mm-5.0 mm, desirably between 0.2 mm and 3.0 mm. The lower limit is to do with the smallest feature size which can in practice be manufactured. The upper limit is to do with the range over which the effect of the outlet can be felt. As with the gas knife of the FIG. 11 embodiment, a chamber 340 is provided. Also in this embodiment the gas knife 410 is provided with humidified gas.

Radially outwardly of the gas knife 410 is an outlet 350 with associated chamber 360 as in the FIG. 11 embodiment.

A notable feature of the FIG. 12 embodiment is that there is no step change in height radially outwardly of the outlet 50. Instead, in order to allow the outer outlet 350 to be positioned at a distance from the substrate W greater than the distance of outlet 50, a feature having a sloping surface, i.e. a sloping wall 450 is provided radially outwardly of the inlet 420 of the gas knife 410. This can help pin the meniscus as the gap which the meniscus needs to bridge widens as the meniscus moves radially outwardly. That is energetically unfavorable. The sloping wall 450 is not parallel to the top surface of the substrate W. Thus, the sloping wall 450 slopes from a surface through which the outlet 50 is formed to a surface through which the outer outlet 350 is formed. This embodiment may reduce damage during collision.

Figure 13:
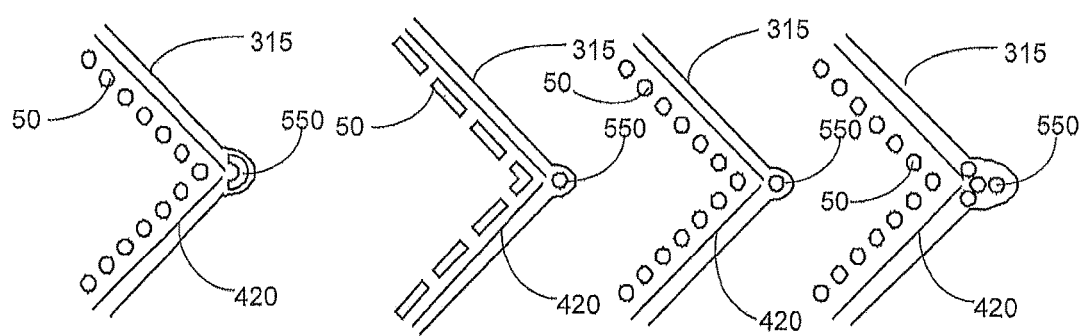
FIG. 13 illustrates, in plan, different configurations of outlet, gas knife and step change in height.

As with FIG. 11, in the FIG. 12 embodiment all of the components are, in plan, circular. However, this need not be the case. Indeed, in FIG. 13 several possible configurations of outlet 50, gas knife inlet 420 and step change in height 315 are illustrated. In the embodiments shown in FIG. 13, outlet 50, gas knife 420 and step change in height 315 are not, in plan, circular. Furthermore, a further outlet 550 is provided at a corner of the outlet 50 configuration. In these embodiments any liquid which is not extracted by outlet 50 is directed by the flow of gas exiting the gas knife inlet 420 towards the corner. A break in the gas knife at the corner allows the liquid to exit the corner where it is then extracted through the further outlet 550. The step change in height 315 contours around the further outlet 550. As can be seen, any shape of outlet 50 or further outlet 550 is possible. For example, the outlet 50 arrangement is shown as being circular or rectangular, in plan, in FIG. 13. The further outlet 550 is shown as either being a single outlet which is circular or crescent shaped or a plurality of circular outlets. As will be appreciated, any shape and any number of further outlets 550 is possible.

Figure 14:
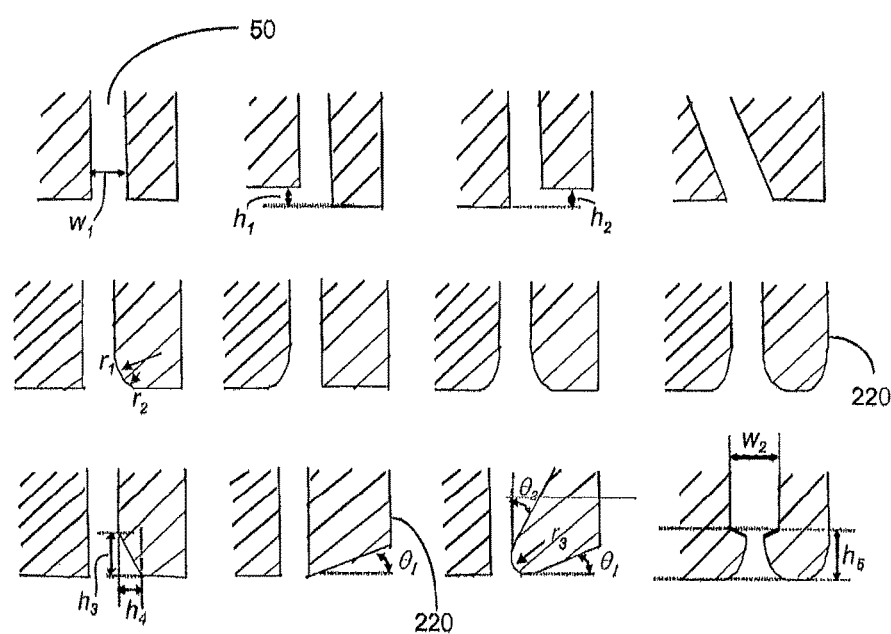
FIG. 14 illustrates, in cross-section, different geometries of outlet.

FIG. 14 shows various embodiments of outlet 50. It will be clear from the foregoing that the outlet 50 can have many different shapes and be many different sizes. FIG. 14 illustrates how the edges of the outlet 50 may vary. The width of an outlet $W_1$ can, for example, range from 0.1 mm-2.0 mm, desirably between 0.4 mm and 1.5 mm. The surfaces on either side of the outlet 50 (radially inwardly and outwardly) may also be at different levels. There may be a height difference between those surfaces $h_1$, $h_2$ of up to 0.5 mm. The radially inwardly surface may be further from the substrate or the radially outwardly surface may be further from the substrate. Also, the outlet 50 does not necessarily extend vertically within the liquid confinement structure 12. The outlet 50 may be formed in the liquid confinement structure 12 at an angle (say of between 60 and 120°) to the surface through which the outlet 50 exits the liquid confinement structure. Furthermore, the corners of the liquid confinement structure may be rounded such that the width (e.g., diameter) of the outlet 50 increases the closer it gets to the surface through which the outlet 50 exits the liquid confinement structure 12. The radially outer edge may be smoothed or the radially inwardly edge may be smoothed. Alternatively, both the radially inwardly and radially outwardly edges may be smoothed. Furthermore, the edge of the step change in height 220 may have a radius. Typical radiuses $r_1$, $r_2$ may be in the range of 0.1 mm to 5 mm or 1 mm to 5 mm or 1 mm to 2 mm. An alternative to having a radiused edge is to have a cut away edge so that the width of the outlet increases linearly as one approaches the surface through which the outlet 50 exits the liquid confinement structure 12. Such a variation can be described by parameters $h_3$ and $h_4$ as illustrated in FIG. 14. $h_3$ can range from 0.5 mm to 3 mm and $h_4$ can range from 0.2 mm to 1 mm. The outer surface (as illustrated) may be modified in this way as well as the inner surface (not illustrated). Also the surface between the outlet 50 and the step change in height 220 may be machined so that it is not parallel to the substrate W or to the remainder of the bottom surface of the liquid confinement structure 12. That surface may be offset at an angle $\theta_1$ of between 0 and 20 degrees. Combinations of having a surface between the outlet 50 and the step change in height 220 at an angle $\theta_1$ and having a radiused corner $r_3$ are possible. Also, as illustrated, the width of the outlet 50 may vary internally so that the outlet becomes wider the further from the surface through which the outlet exits one goes. This can be achieved by angling a wall of the outlet at an angle $\theta_2$ which can be between 0 and 20 degrees from vertical. The final diagram in FIG. 14 shows a hybrid system in which the radially inwardly and outwardly edges of the outlet 50 are radiused as well as the edge of the step change 220. Furthermore, there is a step change in the width of the outlet 50 so that the width of the outlet can be $W_2$ beyond the step change in height which is a distance $h_5$ from the surface through which the outlet 50 exits. $W_2$ can, for example be in the range of 0.5 mm-4 mm and the variable $h_5$ can be between 0.2 mm and 5 mm. Combining and varying the above mentioned geometries and parameters can be used to optimize performance to the desired standard.

The various dimensions in FIG. 14 are applicable to all possible shapes of outlet 50 including circular, rectangular, square as well as continuous slits.

Figure 15:
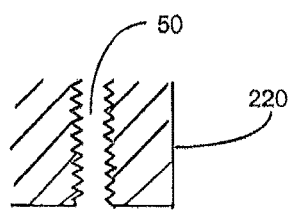
FIG. 15 illustrates, in cross-section, a screw thread outlet.

It may also be advantageous to induce a swirl or controlled turbulence in the gas and liquid mixture exiting the outlet 50. In one embodiment this can be achieved by having the inside surface of the outlet screw-threaded as is illustrated in FIG. 15.

FIGS. 16*a-f* illustrate various different types of outlet 50. FIGS. 16*a-f* also illustrate how the distance between the surface radially outwardly of the outlet 50 and radially inwardly of the step change in height 220 can vary around the periphery of the liquid confinement structure 12. Also illustrated are further gas inlets 52, 223 which can provide gas to specific parts of the periphery of the liquid confinement structure so that an additional gas flow at certain points can be achieved.

FIG. 16*a* is a simple embodiment in which outlets 50 are provided in the form of slits spaced apart from the step change in height 220. FIGS. 16*b* and *c* relate to an embodiment where the outlet 50 is provided as a single slit with a plurality of separation sections 51 in the slit. The separation sections 51 do not extend all the way to the surface through which the outlet 50 exits the liquid confinement structure. The separation sections 51 are effective to segregate flow into a plurality of sections within the slot 50. As is illustrated in FIG. 16*c*, the plan profile of the segregation sections 51 can be such that the segregation section sections 51 are pointed in the radially outward direction. This can help with the creation of the desired gas flow.

In FIG. 16d, recesses 221 in the surface through which the outlet 50 exits the liquid confinement structure are present. The recesses 221 are between the outlet 50 and the step change in height 220. The recesses correspond in position to the position of the separation sections 51.

In FIGS. 16e and f, further gas inlets 52, 223 are illustrated. The gas inlets are provided at positions corresponding to the separation sections 51. Thus, at the position of the separation sections a greater velocity of gas is provided which can help in sealing at those areas. In FIG. 16e, the inlet 52 is provided at the end of a separation section 51. In FIG. 16f, the inlet 223 is provided in the surface between the outlet 50 and the step change in height 220. The edge of the step change in height 220 is contoured around the inlet 223 in FIG. 16f but this is not necessarily the case. Also, although the embodiments of FIGS. 16e and 16f are illustrated in relation to the situation where the outlet 50 is in the form of a slot, these types of inlet 52, 223 can also be used in the situation where the outlet 50 comprises a plurality of discrete outlets such as illustrated in FIG. 16a. In this case the inlets 52, 223 could be provided at locations around the periphery of the liquid confinement structure where the outlets 50 are not present. The inlets could be between outlets or in the surface between the line defining the position of the outlets 50 and the step change in height 220.

FIG. 17 illustrates a further embodiment in which the outlet 50 is provided with a shape, in plan, of a semi-circle. A continuous slit 224 is provided radially outwardly of the outlet 50. The slit 224 provides a flow of gas to the outlet 50.

As will be appreciated, any of the above described features can be used with any other feature and it is not only those combinations explicitly described which are covered in this application.

Embodiments are provided according to the following number clauses:

1. A lithographic projection apparatus arranged to project a pattern from a patterning device onto a substrate through a liquid and comprising a liquid confinement system to at least partly confine the liquid to a space adjacent the substrate, the liquid confinement system comprising a plurality of discrete outlets arranged around the space to at least partly confine the liquid to the space by removing a mixture of (i) liquid from the space and (ii) gas from the atmosphere outside the liquid confinement system.

2. The apparatus of clause 1, wherein each of the outlets is spaced at a distance from each other.

3. The apparatus of clause 1, wherein each of the outlets is connected to a separate under pressure source.

4. The apparatus of clause 1, wherein at least two of the outlets are connected to a common chamber which is held, in use, at an under pressure.

5. The apparatus of clause 1, wherein each of the outlets faces, in use, the substrate.

6. The apparatus of clause 1, wherein each of the outlets is an outlet of an elongate passageway whose longitudinal axis is substantially perpendicular to the substrate.

7. The apparatus of clause 1, wherein each of the outlets is formed in a surface of the liquid confinement system which, in use, faces the substrate and is substantially parallel to a top surface of the substrate.

8. The apparatus of clause 1, wherein the liquid confinement system substantially does not include, in use, any meniscus pinning feature radially inwardly and/or outwardly of the outlets.

9. The apparatus of clause 1, wherein each of the outlets are, in plan, substantially circular, square, rectangular or triangular.

10. The apparatus of clause 1, wherein each of the outlets is, in plan, spaced apart from each other between 0.25 and 10 times their maximum plan dimension.

11. The apparatus of clause 1, wherein the outlets, in plan, have an aspect ratio of between 1 and 0.05.

12. The apparatus of clause 1, wherein the outlets are positioned relative to each other to form, in plan, a polygonal shape.

13. The apparatus of clause 12, wherein the principal axes of the polygonal shape are defined to be substantially parallel to the major directions of travel of the substrate.

14. The apparatus of clause 13, wherein the principal axes have a length ratio of between 4/9 and 8/9.

15. The apparatus of clause 13, wherein the ratio of the length of the major principal axis to the length of the minor principal axis is greater than 1.2 to 1.

16. The apparatus of clause 1, wherein the liquid confinement system further comprises a gas knife positioned radially outwardly of the outlets.

17. The apparatus of clause 16, wherein the gas knife is positioned at a plan distance of between 0.2 mm and 3.0 mm from the outlets.

18. The apparatus of clause 1, wherein the liquid confinement system further comprises a gas inlet positioned radially outwardly of the outlets.

19. The apparatus of clause 1, wherein a surface of the liquid confinement system comprises a step change in distance from the substrate radially outwardly of the outlets, the surface, in use, facing the substrate.

20. The apparatus of clause 19, wherein the step change in distance occurs between 0.2 mm and 10.0 mm from the outlets.

21. The apparatus of clause 1, wherein the liquid confinement system further comprises a further outlet positioned adjacent a corner of the plan shape in which the outlets are arranged.

22. A lithographic projection apparatus having a projection system to project a pattern from a patterning device onto a substrate, the apparatus comprising a liquid confinement structure to at least partly confine a liquid to a space between the projection system and the substrate, the liquid confinement structure comprising a plurality of outlets configured to remove liquid from the space and gas from outside the space to substantially pin a meniscus of the liquid in the space due to the creation of a gas flow.

23. The apparatus of clause 22, wherein each of the outlets are attached to a separate under pressure source.

24. The apparatus of clause 22, wherein each of the outlets is shaped such that two phase substantially annular flow exits through the outlets.

25. A device manufacturing method comprising projecting a patterned beam of radiation onto a substrate through a liquid provided in a space adjacent the substrate, and containing the liquid in the space at least in part by pinning a meniscus of the liquid between adjacent outlets using a gas flow generated by extraction of gas, from outside of the space, through the outlets.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, flat-panel displays, liquid-crystal displays (LCDs), thin-film magnetic heads, etc. The skilled artisan will appreciate that, in the context of such alternative applications, any use of the terms "wafer" or "die" herein may be considered as synonymous with the more general terms "substrate" or "'target portion", respectively. The substrate referred to herein may be processed, before or after exposure, in for example a track (a tool that typically applies a layer of resist to a substrate and develops the exposed resist), a metrology tool and/or an inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

The terms "radiation" and "beam" used herein encompass all types of electromagnetic radiation, including ultraviolet (UV) radiation (e.g. having a wavelength of or about 365, 248, 193, 157 or 126 nm). The term "lens", where the context allows, may refer to any one or combination of various types of optical components, including refractive and reflective optical components.

While specific embodiments of the invention have been described above, it will be appreciated that the invention may be practiced otherwise than as described. For example, the invention may take the form of one or more computer programs containing one or more sequences of machine-readable instructions describing a method as disclosed above, or one or more data storage medium (e.g. semiconductor memory, magnetic or optical disk) having such one or more computer program stored therein. The one or more different controllers referred to herein may be operable when the one or more computer programs are read by one or more computer processors located within at least one component of the lithographic apparatus. One or more processors are configured to communicate with the at least one of the controllers; thereby the controller(s) operate according the machine readable instructions of one or more computer programs.

One or more embodiments of the invention may be applied to any immersion lithography apparatus, in particular, but not exclusively, those types mentioned above and whether the immersion liquid is provided in the form of a bath, only on a localized surface area of the substrate, or is unconfined. In an unconfined arrangement, the immersion liquid may flow over the surface of the substrate and/or substrate table so that substantially the entire uncovered surface of the substrate table and/or substrate is wetted. In such an unconfined immersion system, the liquid supply system may not confine the immersion fluid or it may provide a proportion of immersion liquid confinement, but not substantially complete confinement of the immersion liquid.

A liquid supply system as contemplated herein should be broadly construed. In certain embodiments, it may be a mechanism or combination of structures that provides a liquid to a space between the projection system and the substrate and/or substrate table. It may comprise a combination of one or more structures, one or more liquid inlets, one or more gas inlets, one or more gas outlets, and/or one or more liquid outlets that provide liquid to the space. In an embodiment, a surface of the space may be a portion of the substrate and/or substrate table, or a surface of the space may completely cover a surface of the substrate and/or substrate table, or the space may envelop the substrate and/or substrate table. The liquid supply system may optionally further include one or more elements to control the position, quantity, quality, shape, flow rate or any other features of the liquid.

The descriptions above are intended to be illustrative, not limiting. Thus, it will be apparent to one skilled in the art that modifications may be made to the invention as described without departing from the scope of the claims set out below.

The invention claimed is:

1. A lithographic projection apparatus arranged to project a pattern from a patterning device onto a substrate through a liquid, the lithographic projection apparatus comprising:
a liquid confinement structure to at least partly confine the liquid to a space adjacent the substrate, the liquid confinement structure comprising a plurality of outlets arranged around the space to at least partly confine the liquid to the space by removing a mixture of (i) liquid from the space and (ii) gas from the atmosphere outside the confined liquid, wherein the outlets are formed in a surface of the liquid confinement structure and are positioned relative to each other around the space to form, in plan, a shape comprising a corner;
a discrete opening that does not surround the space, the discrete opening located at least partially outward, relative to the confined liquid, of the outlets and located at the corner, the discrete opening configured to extract liquid which is not extracted by the outlets; and
a fluid supply opening at least partially outward, relative to the confined liquid, of the outlets and located adjacent the discrete opening, the fluid supply opening configured to supply a fluid at least partly extracted by the discrete opening.

2. The apparatus of claim 1, wherein at least two of the outlets are connected to a common chamber which is subject, in use, to a suction.

3. The apparatus of claim 1, wherein each of the outlets faces, in use, the substrate.

4. The apparatus of claim 1, wherein the surface of the liquid confinement structure, in use, faces the substrate and is substantially parallel to a top surface of the substrate.

5. The apparatus of claim 1, wherein each of the outlets is, in plan, spaced apart from each other between 0.25 and 10 times the maximum dimension of their cross-section in the surface.

6. The apparatus of claim 1, wherein the shape is polygonal.

7. The apparatus of claim 6, wherein the principal axes of the polygonal shape are defined to be substantially parallel to the major directions of travel of the substrate.

8. The apparatus of claim 7, wherein the principal axes have a length ratio of between 4/9 and 8/9.

9. The apparatus of claim 7, wherein the ratio of the length of the major principal axis to the length of the minor principal axis is greater than 1.2 to 1.

10. The apparatus of claim 1, wherein an imaginary line passing through the corner and the center of the shape intersects the discrete opening.

11. The apparatus of claim 1, wherein the discrete opening has an arc shape cross-section in the horizontal.

12. The apparatus of claim 1, wherein the surface is a bottom-most planar external surface of the liquid confinement structure at the outlets.

13. A device manufacturing method comprising:
projecting a patterned beam of radiation onto a substrate through a liquid provided in a space adjacent the substrate;
containing the liquid in the space at least in part by pinning a meniscus of the liquid between adjacent outlets of a liquid confinement structure using a gas flow generated by extraction of gas, from outside of the space, through the outlets, wherein the outlets are formed in a surface of the liquid confinement structure and are positioned relative to each other around the space to form, in plan, a shape comprising a corner;

extracting liquid which is not extracted by the outlets using a discrete opening that does not surround the space, the discrete opening located at least partially outward, relative to the contained liquid, of the outlets and located at the corner; and supplying a fluid using a fluid supply opening that is at least partially outward, relative to the contained liquid, of the outlets and is located adjacent the discrete opening, the fluid at least partly extracted by the discrete opening.

14. The method of claim 13, wherein an imaginary line passing through the corner and the center of the shape intersects the discrete opening.

15. A lithographic projection apparatus arranged to project a pattern from a patterning device onto a substrate through a liquid, the lithographic projection apparatus comprising:

a liquid confinement structure to at least partly confine the liquid to a space adjacent the substrate, the liquid confinement structure comprising a plurality of outlets arranged around the space to at least partly confine the liquid to the space by removing a mixture of (i) liquid from the space and (ii) gas from the atmosphere outside the confined liquid, wherein the outlets are formed in a surface of the liquid confinement structure and are positioned relative to each other around the space to form, in plan, a shape comprising a plurality of corners;

a discrete opening that does not surround the space, the discrete opening located at least partially outward, relative to the confined liquid, of the outlets and located at one corner of the plurality of corners and configured to extract liquid which is not extracted by the outlets; and one or more gas supply openings at least partially outward, relative to the confined liquid, of the outlets, the one or more gas supply openings extending along a side of the shape between two corners of the plurality of corners, the one or more gas supply openings configured to supply a gas to displace liquid which is not extracted by the outlets.

16. The apparatus of claim 15, wherein the one or more gas supply openings comprises a plurality of openings arranged in a substantially straight line.

17. The apparatus of claim 15, wherein the surface is a bottom-most planar external surface of the liquid confinement structure at the outlets.

18. The apparatus of claim 15, wherein an imaginary line passing through the one corner and the center of the shape intersects the discrete opening.

19. The apparatus of claim 15, wherein the one or more gas supply openings extend along an essentially straight line between the two corners.

20. The apparatus of claim 15, wherein the discrete opening has an arc shape cross-section in the horizontal.

* * * * *